(12) United States Patent
Jeong et al.

(10) Patent No.: US 8,519,413 B2
(45) Date of Patent: Aug. 27, 2013

(54) ORGANIC LIGHT EMITTING DIODE DISPLAY

(75) Inventors: Hee-Seong Jeong, Yongin (KR); Sung-Soo Koh, Yongin (KR); Tae-Gon Kim, Yongin (KR); Seung-Yeon Cho, Yongin (KR); Chul-Woo Jeong, Yongin (KR); Jae-Yong Kim, Yongin (KR); Chi-Wook An, Yongin (KR); Moo-Soon Ko, Yongin (KR); Ok-Byoung Kim, Yongin (KR)

(73) Assignee: Samsung Display Co., Ltd. (KR)

(*) Notice: Subject to any disclaimer, the term of this patent is extended or adjusted under 35 U.S.C. 154(b) by 103 days.

(21) Appl. No.: 12/966,857

(22) Filed: Dec. 13, 2010

(65) Prior Publication Data

US 2011/0140139 A1 Jun. 16, 2011

(30) Foreign Application Priority Data

Dec. 14, 2009 (KR) .................. 10-2009-0124096

(51) Int. Cl.
*H01L 51/50* (2006.01)
*H01L 25/04* (2006.01)
*H01L 51/52* (2006.01)
*H01L 51/54* (2006.01)

(52) U.S. Cl.
CPC .................. *H01L 25/048* (2013.01)
USPC ........ 257/79; 257/88; 257/E51.022; 438/22; 438/29

(58) Field of Classification Search
CPC .................................... H01L 25/048
USPC ... 257/40, 79, 88–89, 98, E51.001–E51.022, 257/E51.024, E51.026, E51.043, E33.001, 257/E33.013, E33.062, E33.063, E33.064, 257/E33.067, E33.068; 438/22–31, 34–35, 438/99, 650, 686, 688; 313/498; 345/44, 345/76

See application file for complete search history.

(56) References Cited

U.S. PATENT DOCUMENTS

| | | | | |
|---|---|---|---|---|
| 5,907,160 A * | 5/1999 | Wilson et al. | ................... | 257/40 |
| 6,117,529 A * | 9/2000 | Leising et al. | ................ | 428/209 |
| 6,541,130 B2 * | 4/2003 | Fukuda | .......................... | 428/690 |
| 6,563,527 B1 * | 5/2003 | Shimoda et al. | .............. | 347/240 |
| 6,639,250 B1 * | 10/2003 | Shimoda et al. | ................ | 257/98 |
| 7,598,671 B2 * | 10/2009 | Song et al. | ..................... | 313/506 |
| 7,851,814 B2 * | 12/2010 | Vaufrey et al. | .................. | 257/98 |
| 7,872,256 B2 * | 1/2011 | Sung et al. | ...................... | 257/40 |
| 8,040,045 B2 * | 10/2011 | Bechtel et al. | ................ | 313/504 |
| 8,040,055 B2 * | 10/2011 | Koo et al. | ...................... | 313/506 |
| 8,187,482 B2 * | 5/2012 | Song et al. | ........................ | 216/24 |
| 2003/0044639 A1 * | 3/2003 | Fukuda | .......................... | 428/690 |

(Continued)

FOREIGN PATENT DOCUMENTS

| | | |
|---|---|---|
| JP | 2004022438 A | 1/2004 |
| JP | 2006100193 | 4/2006 |

(Continued)

*Primary Examiner* — Matthew Landau
*Assistant Examiner* — Maliheh Malek
(74) *Attorney, Agent, or Firm* — Knobbe Martens Olson & Bear LLP

(57) ABSTRACT

An organic light emitting diode display is disclosed. The display includes a substrate, a first electrode placed on the substrate, an organic emissive layer placed on the first electrode, a second electrode placed on the organic emissive layer, and a refractive layer disposed between the substrate and the first electrode. The refractive layer is greater in refractive index than the first electrode.

13 Claims, 12 Drawing Sheets

(56) References Cited

U.S. PATENT DOCUMENTS

| | | | |
|---|---|---|---|
| 2004/0217700 A1* | 11/2004 | Chang | 313/506 |
| 2005/0017630 A1* | 1/2005 | Ryu et al. | 313/504 |
| 2005/0168849 A1* | 8/2005 | Lin | 359/850 |
| 2005/0280355 A1* | 12/2005 | Lee et al. | 313/503 |
| 2005/0285508 A1* | 12/2005 | Murayama et al. | 313/503 |
| 2007/0015429 A1* | 1/2007 | Maeda et al. | 445/24 |
| 2007/0286944 A1* | 12/2007 | Yokoyama et al. | 427/66 |
| 2008/0062359 A1* | 3/2008 | Inaba et al. | 349/105 |
| 2008/0067926 A1* | 3/2008 | Mizuno et al. | 313/504 |
| 2008/0111474 A1* | 5/2008 | Sung et al. | 313/504 |
| 2008/0137175 A1* | 6/2008 | Lin | 359/295 |
| 2008/0237615 A1* | 10/2008 | Lee et al. | 257/89 |
| 2009/0142983 A1* | 6/2009 | Song et al. | 445/23 |
| 2009/0212692 A1* | 8/2009 | Hasegawa | 313/504 |
| 2010/0001301 A1* | 1/2010 | Karg et al. | 257/98 |
| 2010/0006872 A1* | 1/2010 | Seo et al. | 257/89 |
| 2010/0053043 A1* | 3/2010 | Sakamoto | 345/77 |
| 2010/0118408 A1* | 5/2010 | Lee et al. | 359/599 |
| 2010/0265223 A1* | 10/2010 | Asaki et al. | 345/205 |
| 2010/0320446 A1* | 12/2010 | Kang et al. | 257/40 |
| 2011/0003406 A1* | 1/2011 | Ryu et al. | 438/22 |
| 2011/0031515 A1* | 2/2011 | Mizuno et al. | 257/89 |
| 2011/0042696 A1* | 2/2011 | Smith et al. | 257/89 |
| 2011/0062475 A1* | 3/2011 | Cho | 257/98 |
| 2011/0073884 A1* | 3/2011 | Lee | 257/89 |
| 2011/0084257 A1* | 4/2011 | Kwon et al. | 257/40 |
| 2011/0108864 A1* | 5/2011 | Seo et al. | 257/89 |
| 2011/0140090 A1* | 6/2011 | Jeong et al. | 257/40 |
| 2011/0168976 A1* | 7/2011 | Mao | 257/13 |
| 2011/0180835 A1* | 7/2011 | Ono et al. | 257/98 |
| 2011/0215302 A1* | 9/2011 | Lhee et al. | 257/40 |
| 2011/0241038 A1* | 10/2011 | Kashiwabara et al. | 257/89 |
| 2012/0001206 A1* | 1/2012 | Jeong et al. | 257/89 |
| 2012/0091883 A1* | 4/2012 | Nagai et al. | 313/504 |

FOREIGN PATENT DOCUMENTS

| | | |
|---|---|---|
| KR | 1020050042705 | 5/2005 |
| KR | 100494557 B1 | 6/2005 |
| KR | 1020050122967 | 12/2005 |
| KR | 100760967 B1 | 9/2007 |
| KR | 102008001186 A | 1/2008 |

* cited by examiner

| EML_B 300 | EML_G 300 | EML_R 150 |
| HTL_B 400 | HTL_G 800 | HTL_R 150 |

AI 1000
EIL 10
ETL 260
HIL 325
ITO 1000

(b)

| EML_B 300 | EML_G 300 | EML_R 150 |
| HTL_B 400 | HTL_G 800 | HTL_R 150 |

AI 1000
EIL 10
ETL 260
HIL 325
ITO 1000
RL 500

FIG.6

| Device color characteristic |||||
|---|---|---|---|
| Color || Comparative Example 1 | Example 1 |
| Blue | (x,y) | (0.125, 0.242) | (0.118, 0.166) |
| | Efficiency(%) | 100 | 88.3 (↓) |
| Green | (x,y) | (0.291, 0.625) | (0.212, 0.697) |
| | Efficiency(%) | 100 | 133.0 |
| Red | (x,y) | (0.654, 0.343) | (0.663, 0.335) |
| | Efficiency(%) | 100 | 148.1 |
| Color reproduction rate || 59% | 86% |

| EML_B 300 | EML_G 300 | EML_R 150 |
|---|---|---|
| HTL_B 400 | HTL_G 800 | HTL_R 150 |
| | HIL 325 | |
| | ITO 1000 | |
| | ETL 260 | |
| | EIL 10 | |
| | AI 1000 | |

(b)

| EML_B 300 | EML_G 300 | EML_R 300 |
|---|---|---|
| | HTL 150 | |
| | HIL 525 | |
| | ITO 1000 | |
| RL3 1650 | RL2 1000 | RL1 1300 |
| | ETL 260 | |
| | EIL 10 | |
| | AI 1000 | |

FIG.9

| Device color characteristic |||||
|---|---|---|---|
| Color || Comparative Example 1 | Example 2 |
| Blue | (x,y) | (0.125, 0.242) | (0.115, 0.193) |
| | Efficiency(%) | 100 | 86.3 (↓) |
| Green | (x,y) | (0.291, 0.625) | (0.268, 0.655) |
| | Efficiency(%) | 100 | 114.0 |
| Red | (x,y) | (0.654, 0.343) | (0.658, 0.340) |
| | Efficiency(%) | 100 | 134.3 |
| Color reproduction rate || 59% | 72.2% |

FIG.11

| EML_B 300 | EML_G 300 | EML_R 150 |
|---|---|---|
| HTL_B 400 | HTL_G 800 | HTL_R 150 |

| AI 1000 |
|---|
| EIL 10 |
| ETL 260 |

| HIL 325 |
|---|
| ITO 1000 |

(a)

| EML_B 300 | EML_G 300 | EML_R 150 |
|---|---|---|
| | | ETL_R 150 |

| AI 1000 |
|---|
| EIL 10 |
| ETL 260 |

| ITO3 1300 | ITO2 1700 | ITO1 1000 |
|---|---|---|
| | RL 500 | |

| HIL 325 |
|---|

| Device color characteristic |||||
|---|---|---|---|
| Color || Comparative Example 1 | Example 3 |
| Blue | (x,y) | (0.125, 0.242) | (0.114, 0.179) |
| | Efficiency(%) | 100 | 95.0 (↓) |
| Green | (x,y) | (0.291, 0.625) | (0.218, 0.694) |
| | Efficiency(%) | 100 | 134.1 |
| Red | (x,y) | (0.654, 0.343) | (0.665, 0.333) |
| | Efficiency(%) | 100 | 120.7 |
| Color reproduction rate || 59% | 84.6% |

ORGANIC LIGHT EMITTING DIODE DISPLAY

CROSS-REFERENCE TO RELATED APPLICATIONS

This application claims priority to and the benefit of Korean Patent Application No. 10-2009-0124096 filed in the Korean Intellectual Property Office on Dec. 14, 2009, the entire contents of which are incorporated herein by reference.

BACKGROUND

1. Field

The described technology relates generally to an organic light emitting diode display, and more particularly, to an organic light emitting diode display utilizing a refractive index.

2. Description of the Related Technology

Organic light emitting diode displays have a self emissive characteristic, and have a relatively small thickness and weight. Organic light emitting diode displays generally exhibit high quality characteristics such as low power consumption, high luminance, and short response time.

Organic light emitting diode displays generally include a first substrate with organic light emitting diodes, and a second substrate facing the first substrate to protect the organic light emitting diodes of the first substrate. The organic light emitting diode generally includes an organic emission layer, and first and second electrodes facing with the organic emission layer interposed therebetween.

Conventional organic light emitting diode displays may be classified as (1) top emission type, where the light emitted from the organic light emitting diode is illuminated to the second substrate, (2) bottom emission type, where the light emitted from the organic light emitting diode is illuminated to the first substrate, and (3) dual emission type, where the light emitted from the organic light emitting diode is illuminated to both the first and second substrates.

In top emission type displays, the first electrode is a reflective electrode and the second electrode is a semitransparent electrode. The top emission type displays comprise a microcavity structure.

It is generally challenging to manufacture large-sized top emission type organic light emitting diode displays. The challenge is related to the fact that the second electrode should be thin in order to be semitransparent, but as the second electrode is formed with one layer over the entire area of the organic light emitting diode, the surface resistivity thereof increases with the device enlargement, so that the current flow along the second electrode does not occur fluently.

It is thus generally preferable to use bottom emission type structures for larger displays, where the second electrode can be sufficiently thick.

Generally with bottom emission type displays, light emission efficiency and color reproduction are deteriorated.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One aspect is an organic light emitting diode display including: a substrate, a first electrode placed over the substrate, where the first electrode has a refractive index, an organic emissive layer placed over the first electrode, a second electrode placed over the organic emissive layer, and a refractive layer disposed between the substrate and the first electrode, where the refractive layer has a refractive index that is greater than the refractive index of the first electrode.

Another aspect is an organic light emitting diode display where the refractive index of the refractive layer is between about 2.2 to about 3.0.

Another aspect is an organic light emitting diode display where the refractive layer includes at least one material selected from the group consisting of $TiO_2$, $ZnO_2$, and $ZrO_2$.

Another aspect is an organic light emitting diode display where the organic emissive layer includes a red light emitting layer, a green light emitting layer, and a blue light emitting layer, which are not overlapping with each other when viewing in a direction orthogonal to a display surface of the organic light emitting diode display.

Another aspect is an organic light emitting diode display where the refractive layer includes a first refractive sub-layer disposed between the red light emitting layer and the substrate, a second refractive sub-layer disposed between the green light emitting layer and the substrate, and a third refractive sub-layer disposed between the blue light emitting layer and the substrate, where the first, second, and third refractive sub-layers substantially differ in thickness from each other.

Another aspect is an organic light emitting diode display where the first refractive sub-layer is thicker than the second refractive sub-layer, and the third refractive sub-layer is thicker than the first refractive sub-layer and the second refractive sub-layer.

Another aspect is an organic light emitting diode display where the red light emitting layer, the green light emitting layer and the blue light emitting layer have substantially the same thickness.

Another aspect is an organic light emitting diode display where the first electrode includes a first sub-electrode disposed between the red light emitting layer and the refractive layer, a second sub-electrode disposed between the green light emitting layer and the refractive layer, and a third sub-electrode disposed between the blue light emitting layer and the refractive layer, where the first, second and third sub-electrodes substantially differ in thickness from each other.

Another aspect is an organic light emitting diode display where the first sub-electrode is thicker than the third sub-electrode, and the second sub-electrode is thicker than the first sub-electrode and the third sub-electrode.

Another aspect is an organic light emitting diode display where the first electrode includes a material substantially transparent for visible light, and the second electrode includes a material substantially reflective for visible light.

Another aspect is an organic light emitting diode display including: a substrate, a first electrode substantially transparent with respect to visible light and having a refractive index, where the first electrode includes: a first sub-electrode, a second sub-electrode, and a third sub-electrode, where the first, second and to third sub-electrodes differ in thickness from each other, a refractive layer disposed between the substrate and the first electrode, where the refractive layer has a refractive index that is greater than the refractive index of the first electrode, and is configured to not permit an electric signal or current to flow through it to or from a circuit component of the display other than the first electrode, and where the refractive layer includes: a first refractive sub-layer, a second refractive sub-layer, and a third refractive sub-layer, where the first, second, and third refractive sub-layers differ in thickness from each other, a second electrode substantially reflective with respect to the visible light, and an organic emissive layer placed between the first and second electrodes, where the organic emissive layer includes a main emitting layer configured to emit red light, a second main emitting layer configured to emit green light, and a third main emitting layer configured to emit blue light, Another aspect is an organic light emitting diode display where the first sub-electrode is interposed between the first refractive sub-layer and the first main emitting layer, where the second sub-electrode is interposed between the second refractive sub-layer and the second main emitting layer, where the third sub-electrode is interposed between the third refractive sub-layer and the third main emitting layer.

Another aspect is an organic light emitting diode display where the refractive index of the refractive layer is between about 2.2 to about 3.0.

Another aspect is an organic light emitting diode display where the insulating material includes at least one of $TiO_2$, $ZnO_2$, and $ZrO_2$.

Another aspect is an organic light emitting diode display where the second sub-electrode is thicker than the first sub-electrode, which is thicker than the third sub-electrode.

Another aspect is an organic light emitting diode display, where the display is configured to permit a light beam emitted by the organic emissive layer to the first electrode to be transmitted through the first electrode and to the refractive layer.

Another aspect is an organic light emitting diode display where the display is further configured to permit the light beam to be transmitted through the refractive layer and to the substrate Another aspect is an organic light emitting diode display where the display is further configured to permit the light beam to be reflected at the refractive layer and back towards the first electrode.

Another aspect is an organic light emitting diode display where the light beam is incident to the refractive layer through the first electrode at an incident angle greater than a critical angle of the refractive layer.

BRIEF DESCRIPTION OF THE DRAWINGS

FIGS. 5(a) and (b) are schematic sectional views of main elements in organic light emitting diode displays according to Comparative Example 1 and an exemplary embodiment, respectively.

FIG. 6 is a table showing measurements of color characteristics of the light components of the organic light emitting diode displays of FIG. 5.

FIGS. 8(a) and (b) are schematic sectional views of main elements in organic light emitting diode displays according to Comparative Example 2 and an exemplary embodiment, respectively.

FIG. 9 is a table showing measurements of color characteristics of the light components of the organic light emitting diode displays of FIG. 8.

FIGS. 11(a) and (b) are schematic sectional views of main elements in organic light emitting diode displays according to Comparative Example 3 and an exemplary embodiment, respectively.

FIG. 12 is a table showing measurements of color characteristics of the light components of the organic light emitting diode displays FIG. 11.

DETAILED DESCRIPTION OF CERTAIN INVENTIVE EMBODIMENTS

Figure 1:
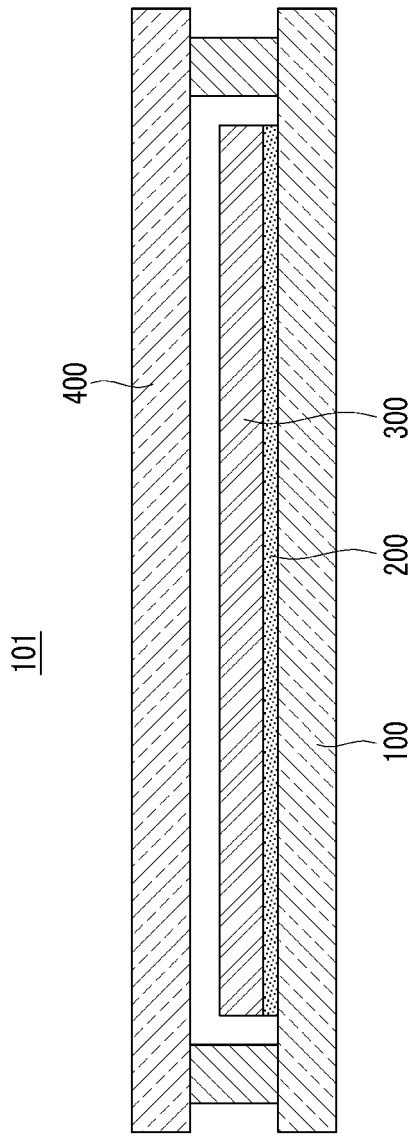
FIG. 1 is a cross-sectional view of an organic light emitting diode display according to an exemplary embodiment.

Certain exemplary embodiments will be described more fully hereinafter with reference to the accompanying drawings. As those skilled in the art would realize, the described embodiments may be modified in various ways, without departing from the spirit or scope of the present invention.

Accordingly, the drawings and description are to be regarded as illustrative in nature, and not restrictive. Like reference numerals generally designate like elements throughout the specification. Furthermore, as the size and thickness of the respective constituent elements shown in the drawings are arbitrarily illustrated for explanatory convenience, embodiments are not necessarily limited to the illustrated.

When an element such as a layer, film, region, or substrate is referred to as being "on" another element, the element may be directly on the other element, or the element may be formed on the other element with intervening elements presenting between the elements.

Throughout the specification, when an element is said to include another constituent element, it may additionally include other constituent elements but may not exclude them unless a specific limitation to the contrary is made. Furthermore, it will be understood throughout the specification that when an element is referred to as being "on" another element, it may be placed over or below the other element but not necessarily placed over the other element, based on the direction of gravity.

An organic light emitting diode display 101 according to an exemplary embodiment will now be described with reference to FIG. 1 thru FIG. 5.

FIG. 1 is a cross-sectional view of an organic light emitting diode display according to an exemplary embodiment.

As shown in FIG. 1, the organic light emitting diode display 101 according to the first exemplary embodiment includes a first substrate 100, driving circuitry 200, an organic light emitting diode 300, and a second substrate 400.

The first substrate 100 and the second substrate 400 are formed with a light transmissive insulating material containing glass, polymer, or the like. The first substrate 100 and the second substrate 400 face each other, and are bonded together by a sealant. Driving circuitry 200 and the organic light emitting diode 300 are positioned between the first substrate 100 and the second substrate 400, and the first substrate 100 and the second substrate 400 protect the driving circuitry 200 and the organic light emitting diode 300 from external interference.

Driving circuitry 200 includes switching and driving thin film transistors 10 and 20 (shown in FIG. 2), and transmits driving signals to the organic light emitting diode 300. The organic light emitting diode 300 emits light in accordance with the signals received from the driving circuitry 200.

The organic light emitting diode 300 is positioned on the driving circuitry 200.

The organic light emitting diode 300 is positioned in a display area on the first substrate 100, and is formed using microelectromechanical systems (MEMS) technology, such as photolithography. The organic light emitting diode 300 receives signals from the driving circuitry 200, and displays an image in accordance with the received signals.

The internal structure of the organic light emitting diode 101 will now be described in detail with reference to FIG. 2 thru FIG. 5.

Figure 2:
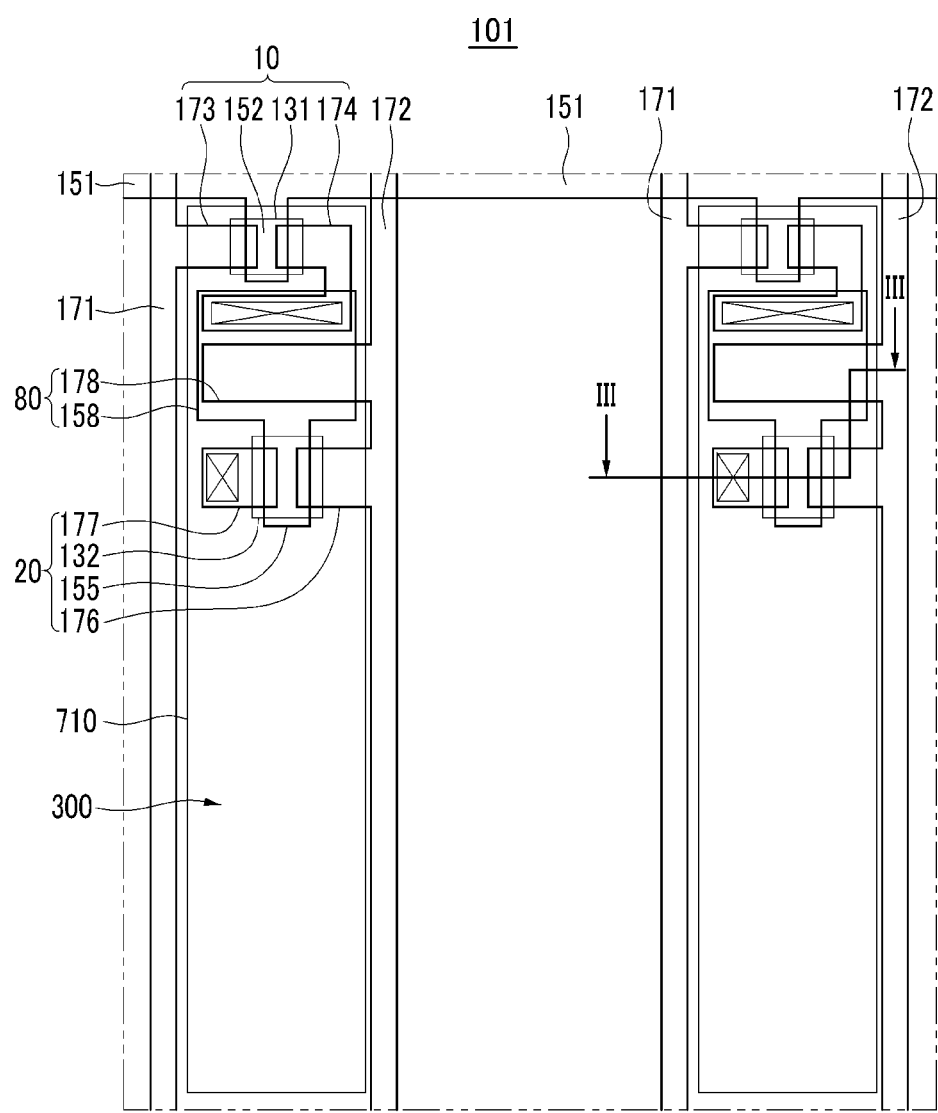
FIG. 2 is a layout view of a pixel structure of an organic light emitting diode display according to an exemplary embodiment.
Figure 3:
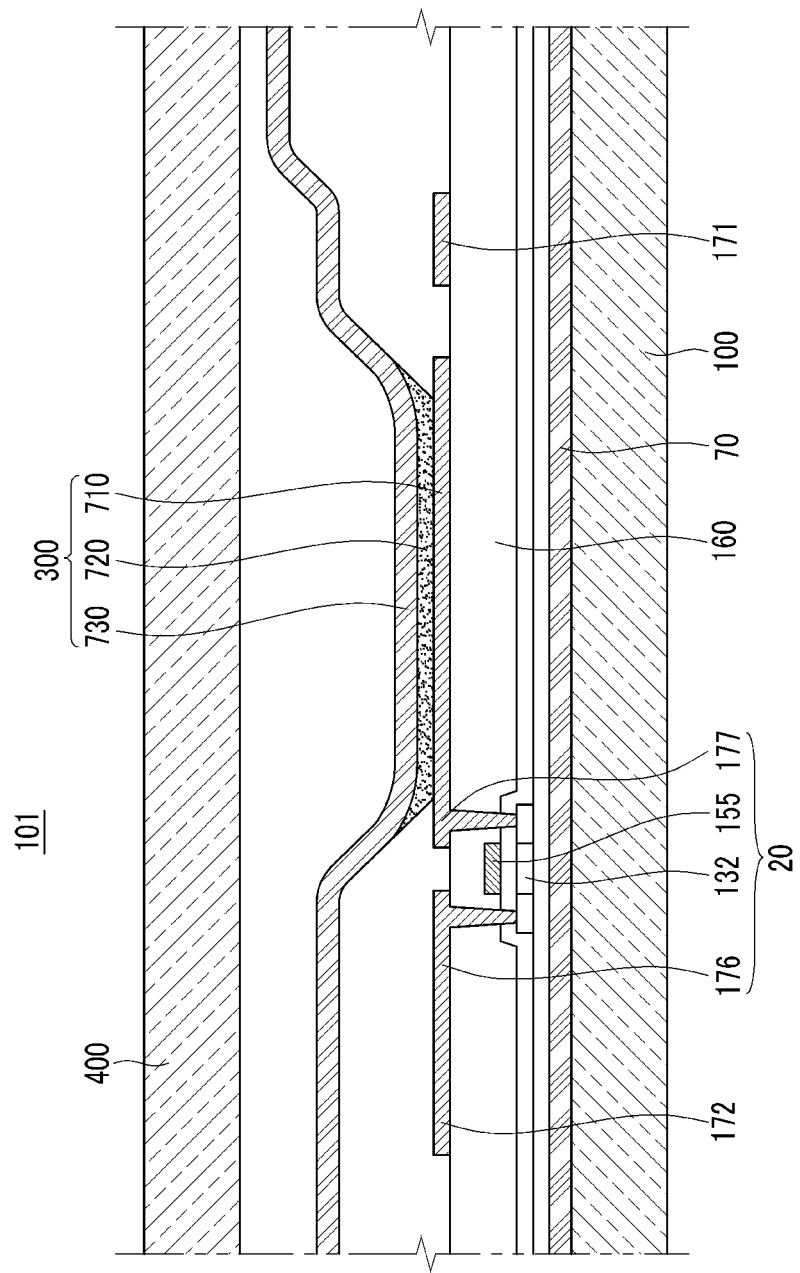
FIG. 3 is a cross-sectional view of the organic light emitting diode display taken along the III-III line of FIG. 2.

FIG. 2 is a layout view of a pixel structure of an organic light emitting diode display according to an exemplary embodiment. FIG. 3 is a cross-sectional view taken along the III-III line of FIG. 2.

One embodiment of the structures of the driving circuitry 200 and the organic light emitting diode 300 are shown in FIGS. 2 and 3. Other structures of driving circuitry 200 and the organic light emitting diode 300 are also possible in other embodiments. For example, although the accompanied drawings illustrate an active matrix (AM) type of organic light emitting diode display having a 2Tr-1Cap structure as a display device, in which one pixel includes two thin film transistors (TFTs) and one capacitor, other embodiments are also possible. The number of thin film transistors, the number of capacitors, and the number of lines of the display device are not limited to the embodiment shown in FIGS. 2 and 3. A pixel refers to the smallest unit displaying an image, and the display device displays an image through a plurality of pixels.

As shown in FIG. 2 and FIG. 3, each pixel of an embodiment of the organic light emitting diode display 101 includes a switching thin film transistor 10, a driving thin film transistor 20, a capacitor 80, an organic light emitting diode 300, and a refractive layer 70. The structure with the switching thin film transistor 10, the driving thin film transistor 20, the capacitor 80, and the refractive layer 70 is referred to as the driving circuitry 200. The driving circuitry 200 further includes gate lines 151 arranged in a direction of the first substrate 100, a data line 171 insulated from and crossing the gate line 151, and a common power line 172. In one embodiment, one pixel may be defined by taking the gate line 151, the data line 171, and the common power line 172.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 may be used as a switch for selecting the pixel to be excited and to thereby emit light. The switching gate electrode 152 is connected to the gate line 151. The switching source electrode 173 is connected to the data line 171. The switching drain electrode 174 is spaced apart from the switching source electrode 173 by a distance, and is connected to either one of capacitor plates (158 in one embodiment) of the capacitor 80.

The driving thin film transistor 20 applies the driving power to the first electrode 710 to excite an organic emission layer 720 of the organic light emitting diode 300 within the pixel. The driving gate electrode 155 is connected to the capacitor plate 158, which is in turn connected to the switching drain electrode 174. The driving source electrode 176 and the other capacitor plate (178 in one embodiment) are connected to the common power line 172. The first electrode 710 of the organic light emitting diode 300 extends from the driving drain electrode 177, and the driving drain electrode 177 and the first electrode 710 are connected to each other.

The capacitor 80 includes a pair of capacitor plates 158 and 178, and an interlayer insulating layer 160 is disposed between the capacitor plates 158 and 178. The interlayer insulating layer 160 may function as a dielectric, and the capacitance of the capacitor 80 is determined by the charges stored in the capacitor 80 and the voltage between the capacitor plates 158 and 178.

The switching thin film transistor 10 is driven by a gate voltage applied to the gate line 151 so as to transmit the data voltage applied to the data line 171 to the driving thin film transistor 20. A voltage corresponding to the difference between the common voltage applied to the driving thin film transistor 20 from the common power line 172, and the data voltage transmitted from the switching thin film transistor 10, is stored at the capacitor 80. A current corresponding to the voltage stored at the capacitor 80 flows to the organic light emitting diode 300 through the driving thin film transistor 20 to cause the organic light emitting diode 300 to emit light.

The organic light emitting diode 300 includes the first electrode 710, an organic emission layer 720 placed on the first electrode 710, and a second electrode 730 placed on the organic emission layer 720.

Figure 4:
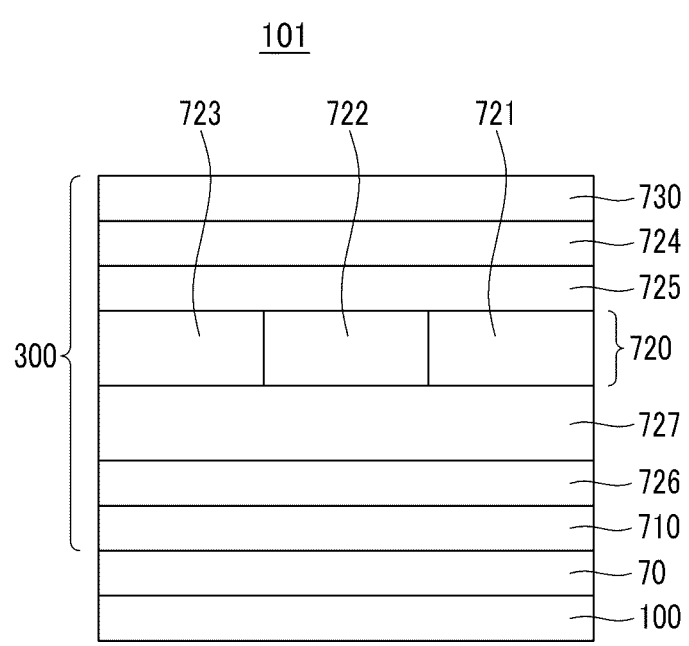
FIG. 4 is a schematic sectional view of main elements of an organic light emitting diode display according to an exemplary embodiment.

FIG. 4 is a schematic sectional view of main elements of the organic light emitting diode display according to an exemplary embodiment.

In the embodiment of FIG. 4, the first electrode 710 is an anode functioning as a hole injection electrode, and the second electrode 730 is a cathode functioning as an electron injection electrode. In other embodiments, the first electrode 710 may function as a cathode, and the second electrode 730 may function as an anode. Holes and electrons from the first and second electrodes 710 and 730 are injected into the organic emission layer 720, and when the excitons, which are recombinations of the injected holes and electrons, drop from the excited state to the ground state, the organic emission layer 720 emits light. The first electrode 710 has a single or multi-layered transparent conductive structure containing at least one of indium tin oxide (ITO), indium zinc oxide (IZO), and silver (Ag), and the second electrode 730 has a single or multi-layered reflective conductive structure containing at least one of aluminum (Al) and silver (Ag).

The organic emission layer 720 includes a first main emitting layer 721 emitting red light, a second main emitting layer 722 emitting green light, and a third main emitting layer 723 emitting blue light. The first to third main emitting layers 721, 722, and 723 each emit light by way of recombinations of the holes and electrons injected from the first and second electrodes 710 and 730.

The organic emission layer 720 further includes an electron injection layer (EIL) 724, an electron transport layer (ETL) 725, a hole injection layer (HIL) 726, and a hole transport layer (HTL) 727.

The electron injection layer 724 and the electron transport layer 725 are disposed between the second electrode 730 and the first to third main emitting layers 721 to 723, and function to inject the electrons from the second electrode 730 to the first to third main emitting layers 721 to 723.

The hole injection layer 726 and the hole transport layer 727 are disposed between the first electrode 710 and the first to third emitting layers 721 to 723 so as to serve to make the holes from the first electrode 710 be fluently injected into the first to third emitting layers 721, 722, and 723.

In a bottom emission type organic light emitting diode display 101 according to an exemplary embodiment, the organic light emitting diode 300 emits light in the direction of the first substrate 100. A refractive layer 70 is disposed between the first substrate 100 and the first electrode 710 on the trajectory of light emission from the organic emission layer 720 to the first substrate 100.

The refractive layer 70 is disposed between the first substrate 100 and the first electrode 710 with a refractive index that is greater than that of the first electrode 710. The refractive layer 70 refracts the light emitted from the organic emission layer 720, based on the refractive index of the refractive layer 70. The refractive index of the refractive layer 70 may be greater than that of the first electrode 710, within a range of about 2.2 to about 3.0. In one embodiment, the refractive index may be about 2.6. Because the refractive layer 70 has a refractive index greater than the first electrode 710, and because the refractive layer is semi-transmissive (it partially transmits and partially reflects light), then the light transmitted to the refractive layer 70 from the first electrode 710 will be reflected back towards the first electrode 710, but due to the lower refractive index of the first electrode 710, light beams above the critical angle at the refractive boundary between the refractive layer 70 and the first electrode 710 will be totally internally reflected. Therefore, the light emitted from the organic emission layer 720 is under a micro-cavity effect between the first electrode 710 and the refractive layer 70, and thereby becomes superior in light emission efficiency and color reproduction rate when illuminated to the outside.

The refractive layer 70 may be formed with a transparent insulating material containing at least one of titanium oxide (TiO2), zinc oxide (ZnO2), and zirconium oxide (ZrO2). Since the refractive layer has a refractive index that is greater than that of the first electrode 710, the light emitted from the organic emission layer 720 and transmitting therethrough via the first electrode 710 is continuously reflected between the first electrode 710 and the refractive layer 70. Accordingly, the light components emitted from the organic emission layer 720 and illuminated to the outside through the first substrate 100 via the first electrode 710 and the refractive layer 70 are mutually reinforced.

In the above embodiment, the light emitted from the organic emission layer 720 and transmitting through the refractive layer 70 is continuously reflected under the micro-cavity effect created between the first electrode 710 and the refractive layer 70 due to the large difference in refractive index between the first electrode 710 and the refractive layer 70. The light components emitted from the organic emission layer 720 and illuminated to the outside through the first substrate 100 are mutually reinforced so that the organic light emitting diode display 101 is enhanced in light emission efficiency and color reproduction rate.

In some embodiments, the first electrode 710 is light transmissive while the second electrode 730 is formed light reflective. In other embodiments, the first electrode 710 may be light reflective while the second electrode 730 may be formed light transmissive. In such embodiments, the refractive layer may be positioned between the second electrode and the second substrate.

In some embodiments, the refractive layer 70 is spaced apart from the first electrode 710 by a distance. In other embodiments, the refractive layer may contact the first electrode. In such embodiments, the refractive layer may be formed with a conductive material or an insulating material.

An exemplary embodiment demonstrating enhanced light emission efficiency and color reproduction rate of an organic light emitting diode display will now be described with reference to FIG. 5 and FIG. 6. The thickness of the elements is indicated by the accompanying number, and the unit of thickness is angstroms (Å).

FIGS. 5(a) and (b) are schematic sectional views of main elements in organic light emitting diode displays according to Comparative Example 1 and an exemplary embodiment, respectively. FIG. 6 is a table showing measurements of color characteristics of the light components of the organic light emitting diode displays of FIG. 5.

FIG. 5(a) is a schematic sectional view of an organic light emitting diode display according to Comparative Example 1. The organic light emitting diode display according to Comparative Example 1 includes a first electrode, an organic emission layer, and a second electrode. The first electrode is formed with an ITO-based transparent layer ITO 1000. The organic emission layer includes a hole injection layer HIL 325, a red subsidiary hole transport layer HTL_R 150, a green subsidiary hole transport layer HTL_G 800, a blue subsidiary hole transport layer HTL_B 400, a first main emitting layer EML_R 150, a second main emitting layer EML_G 300, a third main emitting layer EML_B 300, an electron transport layer ETL 260, and an electron injection layer EIL 10. The second electrode is formed with an aluminum-based reflective layer Al 1000.

Measurements of color characteristics of the light components of the organic light emitting diode display according to Comparative Example 1 are listed in the table of FIG. 6. The efficiency of the red, green, and blue light components measured in the organic light emitting diode display according to Comparative Example 1 is 100%.

FIG. 5(b) is a schematic sectional view of an organic light emitting diode display according to an exemplary embodiment. An organic light emitting diode display according to an exemplary embodiment includes a refractive layer, a first electrode, an organic emission layer, and a second electrode. The refractive layer is formed with a refractive layer RL 500 having a refractive index of 2.6, and the first electrode with an ITO-based transparent layer ITO 1000. The organic emission layer includes a hole injection layer HIL 325, a red subsidiary hole transport layer HTL_R 150, a green subsidiary hole transport layer HTL_G 800, a blue subsidiary hole transport layer HTL_B 400, a first main emitting layer EML_R 150, a second main emitting layer EML_G 300, a third main emitting layer EML_B 300, an electron transport layer ETL 260, and an electron injection layer EIL 10. The second electrode is formed with an aluminum-based reflective layer Al 1000.

Measurements of color characteristics of the light components measured in the organic light emitting diode display according to an exemplary embodiment are listed in the table of FIG. 6.

The efficiency of the red, green, and blue light components measured in the organic light emitting diode display of Comparative Example 1 was compared with that of the exemplary embodiment shown in FIG. 5(b). The efficiency of blue light was deteriorated by about 11.7% in the exemplary embodiment when compared with that of Comparative Example 1, but the efficiencies of red and green lights—were enhanced by about 48.1% and 33%, respectively. There was an improvement of about 27% in terms of color reproduction between the Comparative Example 1 and the exemplary embodiment of FIG. 5(b).

The exemplary embodiment of FIG. 5(b), which includes a refractive layer 70, demonstrates enhanced light emission efficiency and the color reproduction rate. Additionally, the organic light emitting diode display 101 according to the exemplary embodiment of FIG. 5(b) is a bottom emission type, and can thus be used in a large-sized display device for enhancing light emission efficiency and color reproduction rate.

An organic light emitting diode display 102 according to an exemplary embodiment will now be described with reference to FIG. 7.

Figure 7:
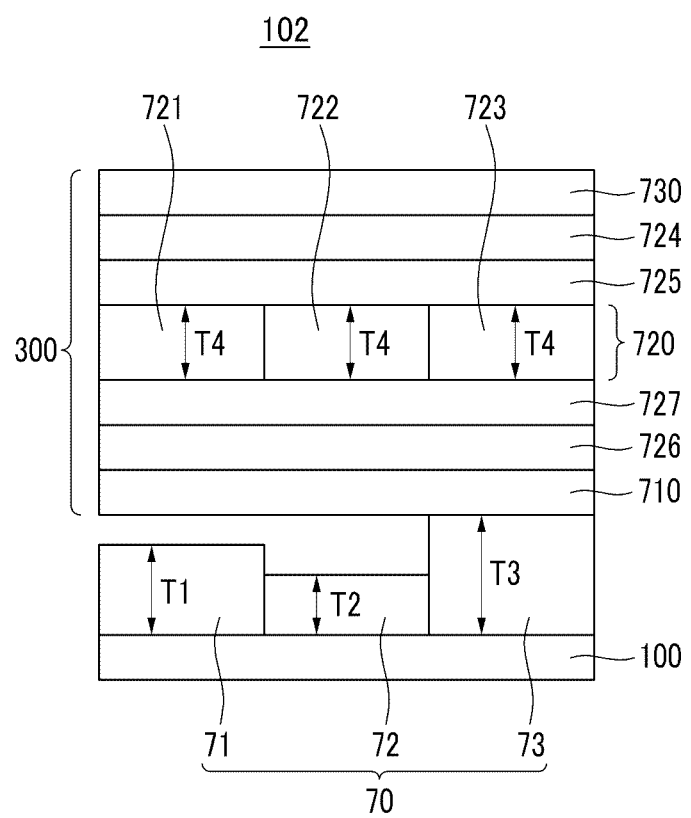
FIG. 7 is a schematic sectional view of main elements of an organic light emitting diode display according to an exemplary embodiment.

FIG. 7 is a schematic sectional view of main elements of an organic light emitting diode display according to an exemplary embodiment.

In the embodiment of FIG. 7, the refractive layer 70 includes a first refractive sub-layer 71, a second refractive sub-layer 72, and a third refractive sub-layer 73.

The first refractive sub-layer 71 is disposed between the first main emitting layer 721 and the first substrate 100 corresponding to the first main emitting layer 721 with a first thickness T1. The red light emitted from the first main emitting layer 721 is refracted while passing through the first refractive sub-layer 71, by the thickness T1 of the first refractive sub-layer 71.

The second refractive sub-layer 72 is disposed between the second main emitting layer 722 and the first substrate 100 corresponding to the second main emitting layer 722 with a second thickness T2 that is smaller than the first thickness T1. The green light emitted from the second main emitting layer 722 is refracted while passing through the second refractive sub-layer 72, by the second thickness T2. The green light emitted from the second main emitting layer 722 is refracted less than the red light emitted from the first main emitting layer 721.

The third refractive sub-layer 73 is disposed between the third main emitting layer 723 and the first substrate 100 corresponding to the third main emitting layer 723 with a third thickness T3 that is larger than the first thickness T1 and the second thickness T2. The blue light emitted from the third main emitting layer 723 is refracted while passing through the third refractive sub-layer 73, by the third thickness T3. The blue light emitted from the third main emitting layer 723 is refracted more than the red light emitted from the first main emitting layer 721 and the green light emitted from the second main emitting layer 722.

The first refractive sub-layer 71, the second refractive sub-layer 72, and the third refractive sub-layer 73 differ in thickness from each other. The first thickness T1 is larger than the second thickness T2, and the third thickness T3 is larger than the first thickness T1 and the second thickness T2. The first to third refractive sub-layers 71, 72, and 73 corresponding to the first to third main emitting layers 721, 722, and 723 of the organic emission layer 720 differ in thickness from each other so that the red, the green, and the blue lights emitted from the first to third main emitting layers 721, 722, and 723 are refracted at different angles, respectively. The refractive layer 70 refracts the red, the green, and the blue lights emitted from the organic emitting layer 720 and passing through the refractive layer 70 at different angles by using the first to third refractive sub-layers 71, 72, and 73, the red, the green, and blue lights emitted from the organic emitting layer 720 and passing through the refractive layer 70 are continuously reflected between the first electrode 710 and the refractive layer 70 at different angles so that the light components emitted from the organic emitting layer 720 and illuminated to the outside through the refractive layer 70 and the first substrate 100 are mutually reinforced.

In the embodiment of FIG. 7, the red, the green, and the blue lights illuminated to the outside through the refractive layer 70 are refracted at different angles so that the microcavity effect is different for each of the red, the green, and the blue lights. Consequently, the light components emitted from the organic emitting layer 720 and illuminated to the outside through the first substrate 100 are mutually reinforced so that the organic light emitting diode display 102 is enhanced in light emission efficiency and color reproduction rate.

The first to third main emitting layers of the organic emission layer 720 each have the same fourth thickness T4.

Removal of the need to differentiate the thickness of the organic emission layer 720, eliminates the need for depositing an organic emission layer by using an additional mask during the formation of the organic emission layer 720, and therefore, the overall time and process of fabricating an organic light emitting diode display 102 are reduced.

An exemplary embodiment demonstrating enhanced light emission efficiency and color reproduction rate of an organic light emitting diode device will now be described with reference to FIG. 8 and FIG. 9. The thickness of the elements is indicated by the accompanying number, and the unit of thickness is angstroms (Å).

FIGS. 8(a) and (b) are schematic sectional views of main elements in organic light emitting diode displays according to Comparative Example 2 and an exemplary embodiment, respectively. FIG. 9 is a table showing measurements of color characteristics of the light components of the organic light emitting diode displays of FIG. 8.

FIG. 8(a) is a schematic sectional view of an organic light emitting diode display according to Comparative Example 2. The organic light emitting diode display according to Comparative Example 2 includes a first electrode, an organic emission layer, and a second electrode. The first electrode is formed with an ITO-based transparent layer ITO 1000. The organic emission layer includes a hole injection layer HIL 325, a red subsidiary hole transport layer HTL_R 150, a green subsidiary hole transport layer HTL_G 800, a blue subsidiary hole transport layer HTL_B 400, a first main emitting layer EML_R 150, a second main emitting layer EML_G 300, a third main emitting layer EML_B 300, an electron transport layer ETL 260, and an electron injection layer EIL 10. The second electrode is formed with an aluminum-based reflective layer Al 1000.

Measurements of color characteristics of the light components of the organic light emitting diode display according to Comparative Example 2 are listed in the table of FIG. 9. The efficiency of the red, the green, and the blue light components measured in the organic light emitting diode display according to Comparative Example 2 is 100%.

FIG. 8(b) is a schematic sectional view of an organic light emitting diode display according to an exemplary embodiment. An organic light emitting diode display according to an exemplary embodiment includes a refractive layer, a first electrode, an organic emission layer, and a second electrode. The refractive layer includes a first refractive sub-layer RL1 1300, a second refractive sub-layer RL2 1000, and a third refractive sub-layer RL3 1650 each with a refractive index of 2.6. The first electrode is formed with an ITO-based transparent layer ITO 1000. The organic emission layer includes a hole injection layer HIL 525, a hole transport layer HTL 150, a first main emitting layer EML_R 300, a second main emitting layer EML_G 300, a third main emitting layer EML_B 300, an electron transport layer ETL 260, and an electron injection layer EIL 10. The second electrode is formed with an aluminum-based reflective layer Al 1000.

Measurements of color characteristics of the light components measured in the organic light emitting diode display according to an exemplary embodiment are listed in the table of FIG. 9.

The efficiency of the red, green, and blue light components measured in the organic light emitting diode of Comparative Example 2 was compared with that of the exemplary embodiment shown in FIG. 8(b). The efficiency of blue light was deteriorated by about 13.7% in the exemplary embodiment when compared with that of the Comparative Example 2, but the efficiencies of the red and green light components were enhanced by about 34.3% and about 14%, respectively. There was an improvement of about 13.2% in terms of color reproduction rate between the Comparative Example 2 and the exemplary embodiment of FIG. 8(b).

The exemplary embodiment of FIG. 8(b), which includes a refractive layer 70 demonstrates enhanced light emission efficiency and color reproduction rate. Additionally, the organic light emitting diode display 102 according to the exemplary embodiment of FIG. 8(b) is a bottom emission type, and can thus be used in a large-sized display device for enhancing light emission efficiency and color reproduction rate.

The use of first to third refractive sub-layers 71 to 73 that differ in thickness from each other minimizes the need to differentiate the thickness of the organic emission layer 720 in accordance with the wavelength of the red, green, or blue light emitted from the organic emission layer 720. This eliminates the need for depositing an organic emission layer 720 by using an additional mask, and therefore, the overall time and process of fabricating an organic light emitting diode display 102 are reduced.

An organic light emitting diode display 103 according to an exemplary embodiment will now be described with reference to FIG. 10.

Figure 10:
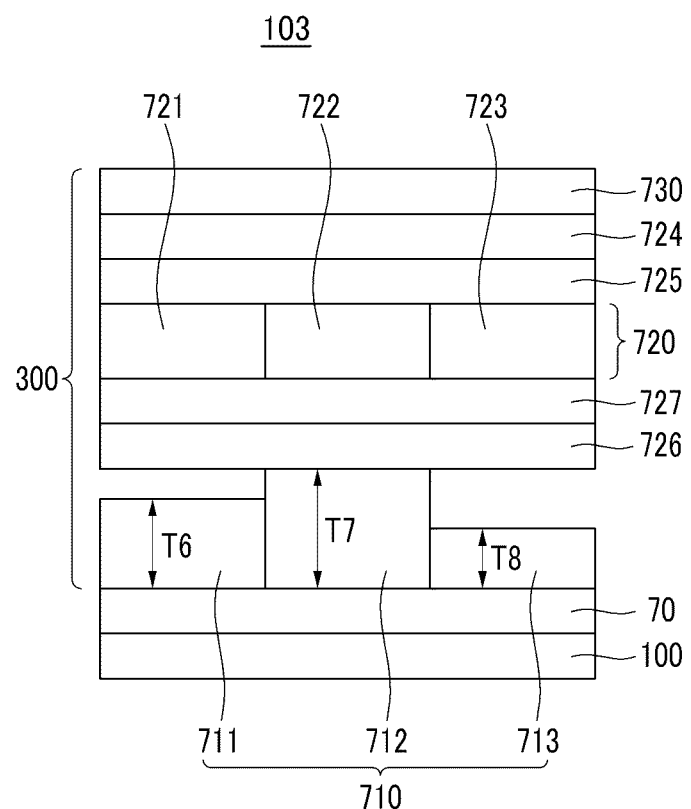
FIG. 10 is a schematic sectional view of main elements in an organic light emitting diode display according to an exemplary embodiment.

FIG. 10 is a schematic sectional view of main elements of an organic light emitting diode display according to an exemplary embodiment.

In the embodiment of FIG. 10, the first electrode 710 includes a first sub-electrode 711, a second sub-electrode 712, and a third sub-electrode 713.

The first sub-electrode 711 is disposed between the first main emitting layer 721 and the refractive layer 70 corresponding to the first main emitting layer 721 with a sixth thickness T6. The red light emitted from the first main emitting layer 721 is refracted while passing through the first sub-electrode 711, by the sixth thickness T6.

The second sub-electrode 712 is disposed between the second main emitting layer 722 and the refractive layer 70 corresponding to the second main emitting layer 722 with a seventh thickness T7 that is larger than the sixth thickness T6. The green light emitted from the second main emitting layer 722 is refracted while passing through the second sub-electrode 712, by the seventh thickness T7. The green light emitted from the second main emitting layer 722 is thus refracted more than the red light emitted from the first main emitting layer 721.

The third sub-electrode 713 is disposed between the third main emitting layer 723 and the refractive layer 70 corresponding to the third main emitting layer 723 with an eighth thickness T8 that is smaller than both the sixth thickness T6 and the seventh thickness T7. The blue light emitted from the third main emitting layer 723 is refracted while passing through the third sub-electrode 713, by the eighth thickness T8. The blue light emitted from the third main emitting layer 723 is thus refracted less than the red light emitted from the first main emitting layer 721 and the green light emitted from the second main emitting layer 722.

The first sub-electrode 711, the second sub-electrode 712, and the third sub-electrode 713 differ in thickness from each other. The sixth thickness T6 of the first sub-electrode 711 is larger than the eighth thickness T8 of the third sub-electrode 713, and the seventh thickness T7 of the second sub-electrode 712 is larger than the sixth thickness T6 of the first sub-electrode 711 and the eighth thickness T8 of the third sub-electrode 713.

The first to third sub-electrodes 711, 712, and 713 corresponding to the first to third main emitting layers 721, 722, and 723 of the organic emission layer 720 differ in thickness from each other so that the red, the green, and the blue lights emitted from the first to third main emitting layers 721, 722, and 723 refracted at different angles are further refracted while passing through the refractive layer 70. As the red, the green, and the blue lights emitted from the organic emission layer 720 and passing through the first electrode 710, which are refracted at different angles by using the first to third sub-electrodes 711, 712, and 713 of the first electrode, are further refracted by using the refractive layer 70, the red, the green, and the blue lights emitted from the organic emission layer 720 and passing through the refractive layer 70 are continuously reflected between the first electrode 710 and the refractive layer 70 at different angles so that the light components emitted from the organic emission layer 720 and illuminated to the outside through the first electrode 710, the refractive layer 70, and the first substrate 100 are mutually reinforced.

In the embodiment of FIG. 10, the red, the green, and the blue lights illuminated to the outside through the first electrode 710 refracted at different angles are further refracted by using the refractive layer 70 so that the micro-cavity effect is different for each of the red, the green, and the blue lights. Consequently, the light components emitted from the organic emission layer 720 and illuminated to the outside through the first substrate 100 are mutually reinforced so that the organic light emitting diode display 103 is enhanced in light emission efficiency and color reproduction rate.

An exemplary embodiment demonstrating enhanced light emission efficiency and color reproduction rate will now be described with reference to FIG. 11 and FIG. 12. The thickness of the elements is indicated by the accompanying number, and the unit of thickness is angstroms (Å).

FIGS. 11(a) and (b) are schematic sectional views of main elements in organic light emitting diode displays according to Comparative Example 3 and an exemplary embodiment, respectively. FIG. 12 is a table showing measurements of color characteristics of the light components of the organic light emitting diode displays FIG. 11.

FIG. 11(a) is a schematic sectional view of an organic light emitting diode display according to Comparative Example 3. The organic light emitting diode display according to Comparative Example 3 includes a first electrode, an organic emission layer, and a second electrode. The first electrode is formed with an ITO-based transparent layer ITO 1000. The organic emission layer includes a hole injection layer HIL 325, a red subsidiary hole transport layer HTL_R 150, a green subsidiary hole transport layer HTL_G 800, a blue subsidiary hole transport layer HTL_B 400, a first main emitting layer EML_R 150, a second main emitting layer EML_G 300, a third main emitting layer EML_B 300, an electron transport layer ETL 260, and an electron injection layer EIL 10. The second electrode is formed with an aluminum-based reflective layer Al 1000.

Measurements of color characteristics of the light components of the organic light emitting diode display according to Comparative Example 3, are listed in the table of FIG. 12. The efficiency of the red, the green, and the blue light components measured in the organic light emitting diode display according to Comparative Example 2 is 100%.

FIG. 11(b) is a schematic sectional view of an organic light emitting diode display according to an exemplary embodiment. An organic light emitting diode display according to an exemplary embodiment includes a refractive layer, a first electrode, an organic emission layer, and a second electrode. The refractive layer is formed with a refractive layer RL 500 having a refractive index of 2.6. The first electrode includes first to third ITO-based sub-electrodes ITO1 1000, ITO2 1700, and ITO3 1300, and the organic emission layer includes a hole injection layer HIL 325, a red subsidiary hole transport layer HTL_R 150, a first main emitting layer EML_R 150, a second main emitting layer EML_G 300, a third main emitting layer EML_B 300, an electron transport layer ETL 260, and an electron injection layer EIL 10. The second electrode is formed with an aluminum-based reflective layer Al 1000.

Measurements of color characteristics of the light components measured in the organic light emitting diode display according to the exemplary embodiment of FIG. 11(b) are listed in the table of FIG. 12.

The efficiency of the red, green, and blue light components measured in the organic light emitting diode display of Comparative Example 3 was compared with that of the exemplary embodiment shown in FIG. 11(b). The efficiency of blue light was deteriorated by about 5% in the exemplary embodiment when compared with that of the Comparative Example 3, but the efficiencies of the red and green light components were enhanced by about 20.7% and about 34.1%, respectively. There was an improvement of about 25.6% in terms of color reproduction rate between the Comparative Example 3 and the exemplary embodiment of FIG. 11(b).

The exemplary embodiment of FIG. 11(b), which includes a refractive layer 70, and a first electrode 710 with first to third sub-electrodes 711, 712, and 713 that differ in thickness, demonstrates enhanced light emission efficiency and color reproduction rate. Additionally, the organic light emitting diode display 103 according to the exemplary embodiment of FIG. 11(b) is a bottom emission type, and can thus be used in a large-sized display device for enhancing light emission efficiency and color reproduction rate.

While this disclosure has been described in connection with certain exemplary embodiments, it is to be understood that the invention is not limited to the disclosed embodiments, but, on the contrary, is intended to cover various modifications and equivalent arrangements.

What is claimed is:

1. An organic light emitting diode display comprising:
   a substrate;
   a first electrode placed over the substrate, wherein the first electrode has a refractive index;
   an organic emissive layer placed over the first electrode, wherein the organic emissive layer comprises a red light emitting layer, a green light emitting layer, and a blue light emitting layer, which are not overlapping with each other when viewing in a direction orthogonal to a display surface of the organic light emitting diode display;
   a second electrode placed over the organic emissive layer; and
   a refractive layer disposed between the substrate and the first electrode, wherein the refractive layer has a refractive index that is greater than the refractive index of the first electrode and is between about 2.2 to about 3.0 and wherein the refractive layer comprises a first refractive sub-layer disposed between the red light emitting layer and the substrate, a second refractive sub-layer disposed between the green light emitting layer and the substrate, and a third refractive sub-layer disposed between the blue light emitting layer and the substrate, wherein the first, second, and third refractive sub-layers substantially differ in thickness from each other and wherein the first refractive sub-layer is thicker than the second refractive sub-layer, and the third refractive sub-layer is thicker than the first refractive sub-layer and the second refractive sub-layer.

2. The organic light emitting diode display of claim 1, wherein the refractive layer comprises at least one material selected from the group consisting of $TiO_2$, $ZnO_2$, and $ZrO_2$.

3. The organic light emitting diode display of claim 1, wherein the first electrode comprises a material substantially transparent for visible light, and the second electrode comprises a material substantially reflective for visible light.

4. An organic light emitting diode display comprising:
   a substrate;
   a first electrode substantially transparent with respect to visible light and having a refractive index, wherein the first electrode comprises:
      a first sub-electrode;
      a second sub-electrode; and
      a third sub-electrode;
      wherein the first, second and third sub-electrodes differ in thickness from each other;
   a refractive layer disposed between the substrate and the first electrode, wherein the refractive layer has a refractive index that is greater than the refractive index of the first electrode and wherein the refractive layer comprises:
      a first refractive sub-layer;
      a second refractive sub-layer; and
      and a third refractive sub-layer;
      wherein the first, second, and third refractive sub-layers differ in thickness from each other, wherein the second sub-electrode is thicker than the first sub-electrode, which is thicker than the third sub-electrode;
   a second electrode substantially reflective with respect to the visible light; and
   an organic emissive layer placed between the first and second electrodes, wherein the organic emissive layer comprises a first main emitting layer configured to emit red light, a second main emitting layer configured to emit green light, and a third main emitting layer configured to emit blue light.

5. The organic light emitting diode display of claim 4, wherein the first sub-electrode is interposed between the first refractive sub-layer and the first main emitting layer,
   wherein the second sub-electrode is interposed between the second refractive sub-layer and the second main emitting layer,
   wherein the third sub-electrode is interposed between the third refractive sub-layer and the third main emitting layer.

6. The organic light emitting diode display of claim 4, wherein the refractive index of the refractive layer is between about 2.2 to about 3.0.

7. The organic light emitting diode display of claim 4, wherein the insulating material comprises at least one of TiO2, ZnO2, and ZrO2.

8. The organic light emitting diode display of claim 4, wherein the display is configured to permit a light beam emitted by the organic emissive layer to the first electrode to be transmitted through the first electrode and to the refractive layer.

9. The organic light emitting diode display of claim 4, wherein the display is further configured to permit the light beam to be transmitted through the refractive layer and to the substrate.

10. The organic light emitting diode display of claim 1, wherein the display is further configured to permit the light beam to be reflected at the refractive layer and back towards the first electrode.

11. The organic light emitting diode display of claim 4, wherein the light beam is incident to the refractive layer through the first electrode at an incident angle greater than a critical angle of the refractive layer.

12. An organic light emitting diode display comprising:
   a substrate;
   a first electrode placed over the substrate, wherein the first electrode has a refractive index, wherein the first electrode comprises a first sub-electrode disposed between the red light emitting layer and the refractive layer, a second sub-electrode disposed between the green light emitting layer and the refractive layer, and a third sub-electrode disposed between the blue light emitting layer and the refractive layer, wherein the first, second and third sub-electrodes substantially differ in thickness from each other, wherein the first sub-electrode is thicker than the third sub-electrode, and the second sub-electrode is thicker than the first sub-electrode and the third sub-electrode;
   an organic emissive layer placed over the first electrode, wherein the organic emissive layer comprises a red light emitting layer, a green light emitting layer, and a blue light emitting layer, which are not overlapping with each other when viewing in a direction orthogonal to a display surface of the organic light emitting diode display;
   a second electrode placed over the organic emissive layer; and
   a refractive layer disposed between the substrate and the first electrode, wherein the refractive layer has a refractive index that is greater than the refractive index of the first electrode and is between about 2.2 to about 3.0.

13. The organic light emitting diode display of claim 12, wherein the red light emitting layer, the green light emitting layer and the blue light emitting layer have substantially the same thickness.

* * * * *